(12) United States Patent
Hsu et al.

(10) Patent No.: US 11,756,873 B2
(45) Date of Patent: Sep. 12, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chia-Kuei Hsu, Hsinchu (TW); Ming-Chih Yew, Hsinchu (TW); Tsung-Yen Lee, Changhua County (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 92 days.

(21) Appl. No.: 17/186,008

(22) Filed: Feb. 26, 2021

(65) Prior Publication Data
US 2022/0278037 A1  Sep. 1, 2022

(51) Int. Cl.
| | |
|---|---|
| *H01L 23/498* | (2006.01) |
| *H01L 21/48* | (2006.01) |
| *H01L 21/56* | (2006.01) |
| *H01L 25/18* | (2023.01) |
| *H01L 25/00* | (2006.01) |
| *H01L 23/31* | (2006.01) |
| *H01L 23/00* | (2006.01) |

(52) U.S. Cl.
CPC .... *H01L 23/49838* (2013.01); *H01L 21/4857* (2013.01); *H01L 21/561* (2013.01); *H01L 21/563* (2013.01); *H01L 23/49822* (2013.01); *H01L 25/18* (2013.01); *H01L 25/50* (2013.01); *H01L 23/3185* (2013.01); *H01L 23/3192* (2013.01); *H01L 24/92* (2013.01); *H01L 2224/92125* (2013.01)

(58) Field of Classification Search
CPC ........... H01L 23/49838; H01L 21/4857; H01L 21/563; H01L 23/49822
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |

(Continued)

OTHER PUBLICATIONS

"Office Action of Taiwan Counterpart Application", dated Jul. 22, 2022, p1-p9.

*Primary Examiner* — Nicholas J Tobergte
(74) *Attorney, Agent, or Firm* — JCIPRNET

(57) ABSTRACT

A semiconductor package and a manufacturing method for the semiconductor package are provided. The semiconductor package at least has a semiconductor die and a redistribution layer disposed on an active surface of the semiconductor die and electrically connected with the semiconductor die. The redistribution layer has a wiring-free zone arranged at a location below a corner of the semiconductor die. An underfill is disposed between the semiconductor die and the redistribution layer. The wiring-free zone is located below the underfill and is in contact with the underfill. The wiring-free zone extends horizontally from the semiconductor die to the underfill.

20 Claims, 14 Drawing Sheets

(56) References Cited

U.S. PATENT DOCUMENTS

| | | |
|---|---|---|
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,276,548 B2 | 4/2019 | Chen et al. |
| 10,854,552 B2 | 12/2020 | Wu et al. |
| 2008/0122059 A1* | 5/2008 | Chou ................. H01L 24/73 257/686 |
| 2016/0189980 A1* | 6/2016 | Paek ............ H01L 23/49816 438/126 |
| 2019/0252323 A1* | 8/2019 | Chiu .................. H01L 28/10 |
| 2020/0395335 A1 | 12/2020 | Chen et al. |
| 2021/0193542 A1* | 6/2021 | Chang ........... H01L 23/49822 |

* cited by examiner

SEMICONDUCTOR PACKAGE AND MANUFACTURING METHOD THEREOF

BACKGROUND

Semiconductor dies may be processed and packaged with other semiconductor devices or dies, and conductive routing structures are formed for routing and interconnecting the dies and/or semiconductor devices in the packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
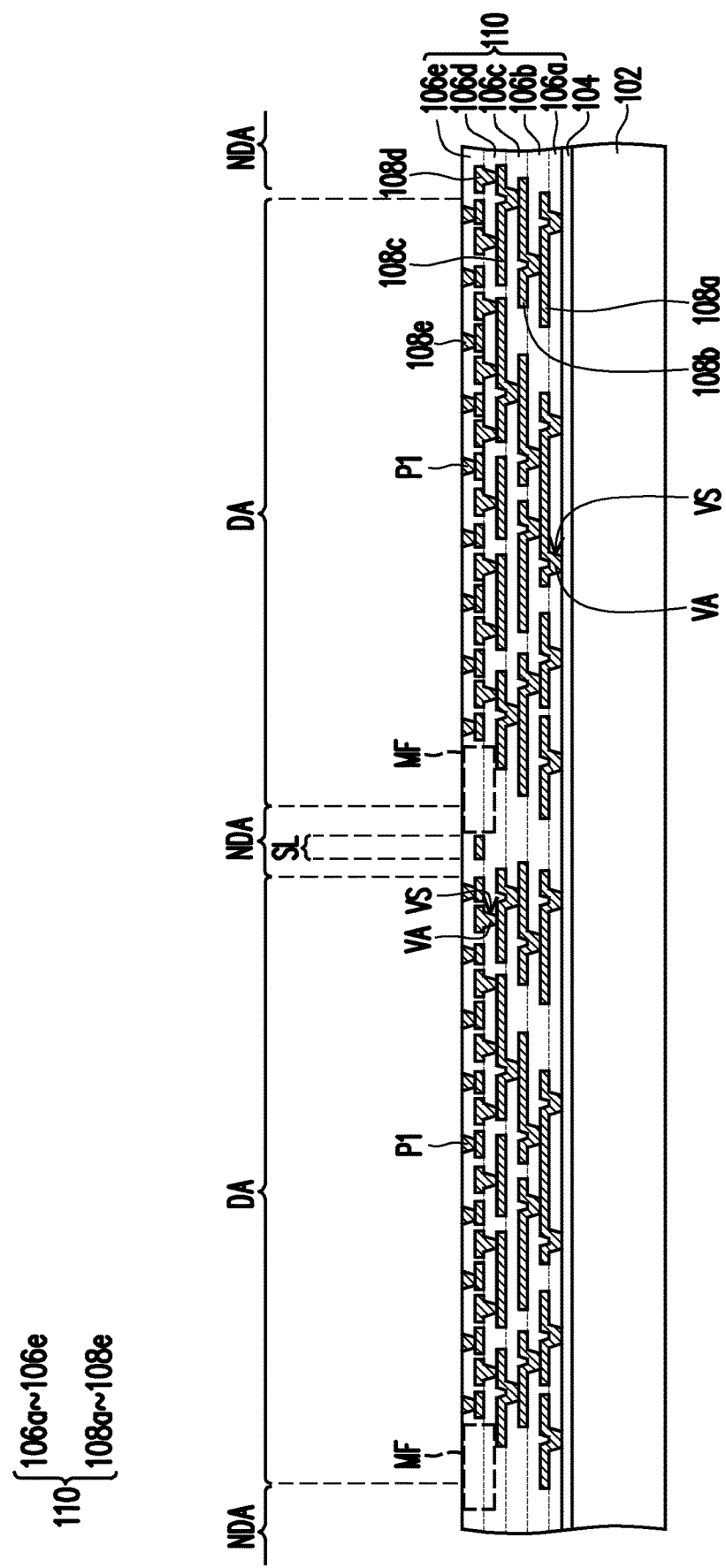
FIG. 1 to FIG. 8 are schematic cross-sectional views of various stages in a manufacturing method of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 8 are schematic sectional views of various stages in a method of fabricating a package structure in accordance with some embodiments of the present disclosure.

Referring to FIG. 1, a carrier 102 with a debonding layer 104 coated thereon is provided. In some embodiments, the carrier 102 may be a glass carrier or any suitable semiconductor carrier for the manufacturing method of the integrated fan-out (InFO) package structure. In some embodiments, the debonding layer 104 may be any material suitable for bonding and debonding the carrier 102 from the above layer(s) or any wafer(s) disposed thereon. In some embodiments, the debonding layer 104 may include a light-to-heat-conversion (LTHC) release coating film. In a further alternative embodiment, the debonding layer 104 may include a dielectric material layer made of an ultra-violet (UV) glue, which loses its adhesive property when exposed to UV lights. In certain embodiments, the debonding layer 104 may be dispensed as a liquid and cured, or may be a laminate film laminated onto the carrier 102. In certain embodiments, the debonding layer 104 is, for example, a LTHC layer with good chemical resistance, and such layer enables room temperature debonding from the carrier 102 by applying laser irradiation.

Referring to FIG. 1, after providing the carrier 102 and the debonding layer 104, a redistribution layer 110 is formed on the debonding layer 104. In some embodiments, the redistribution layer 110 includes dielectric layers 106a, 106b, 106c, 106d, 106e and conductive layers 108a, 108b, 108c, 108d, 108e arranged in alternation, and the conductive layers 108a, 108b, 108c, 108d, 108e are sandwiched between the dielectric layers 106a, 106b, 106c, 106d, 106e. For example, the conductive layer 108a may be constituted by a plurality of metallic redistribution patterns. In some embodiments, the formation of the redistribution layer 110 includes forming a layer of dielectric material (not shown), patterning the layer of dielectric material to form openings, depositing a metallic material filling up the openings to form metallization patterns. Depending on the number of the layers to be formed, these processes may be repeated several times, and the layers may be expressed based on the formation sequence. In some embodiments, the dielectric layers 106a, 106b, 106c, 106d, 106e further include via openings VS revealing the underlying layer. In some embodiments, the conductive layers 108a, 108b, 108c, 108d, 108e may include electrically connected routing traces or fan-out traces, some of them are interconnected with one another by the conductive vias VA. In some embodiments, the topmost conductive layer 108e may include bond pads P1. During the formation of the dielectric layers and the conductive layers for the redistribution layer 110, wiring-free zones (or metal-free zones) MF are defined. In some embodiments, the formation of the wiring free zones MF involves forming more than one dielectric layers without forming an opening or cavity in the dielectric material within the wiring free zones. By doing so, no metal or metallization patterns are formed in the wiring-free zones MF, and the wiring-free zones MF may be regarded as metal-free dielectric blocks or dielectric blocks having substantially zero metal density. In some embodiments, the redistribution layer 110 has an average metal density of about 60% except for the wiring-free zones MF. That is, the number of the metallic wirings per area unit of the whole redistribution layer 110 is about 60%, while the wiring-free zones MF have about zero metal density.

As illustrated in FIG. 1, corresponding to the subsequently mounted semiconductor dies and other later performed processes, die attaching regions DA and non-die attaching regions NDA are determined. Also, the scribe lanes SL are determined and are located within the non-die attaching regions NDA. In some embodiments, the wiring-free zones MF may extend from the die attaching regions DA to the non-die attaching regions NDA but are located outside of the scribe lanes SL.

For simplicity, the dielectric layers 106a, 106b, 106c, 106d, 106e may be regarded as one single dielectric structure and the conductive layers 108a, 108b, 108c, 108d, 108e may be illustrated as conductive redistribution patterns embedded in the dielectric layers. However, from the perspective of the manufacturing process, the dielectric layers 106a, 106b, 106c, 106d, 106e are formed in sequence as five dielectric layers, and the redistribution conductive layers 108a, 108b, 108c, 108d, 108e are also formed in sequence and each sandwiched between the two adjacent dielectric layers.

In some embodiments, the materials of the conductive layers 108a, 108b, 108c, 108d, 108e include aluminum, titanium, copper, nickel, tungsten, cobalt and/or alloys thereof. The conductive layer 108a, 108b, 108c, 108d, or 108e may be formed by, for example, electroplating, deposition, and/or photolithography and etching. In some embodiments, the conductive layer 108a, 108b, 108c, 108d, or 108e may further optionally includes a seed layer if formed by plating. In some embodiments, the materials of the dielectric layers 106a, 106b, 106c, 106d, 106e include polyimide, epoxy resin, acrylic resin, phenol resin, benzocyclobutene (BCB), polybenzooxazole (PBO), or any other suitable polymer-based dielectric material. The dielectric layer 106a, 106b, 106c, 106d, or 106e, for example, may be formed by suitable fabrication techniques such as spin-on coating, chemical vapor deposition (CVD), plasma-enhanced chemical vapor deposition (PECVD), or the like.

It is noted that the number of the conductive layers and the number of the dielectric layers of the redistribution layer 110 illustrated in FIG. 1 are merely for illustrative purposes, and the disclosure is not limited thereto. In some alternative embodiments, less or more layers of the conductive layers and/or dielectric layers may be formed depending on the design requirement.

Figure 2:
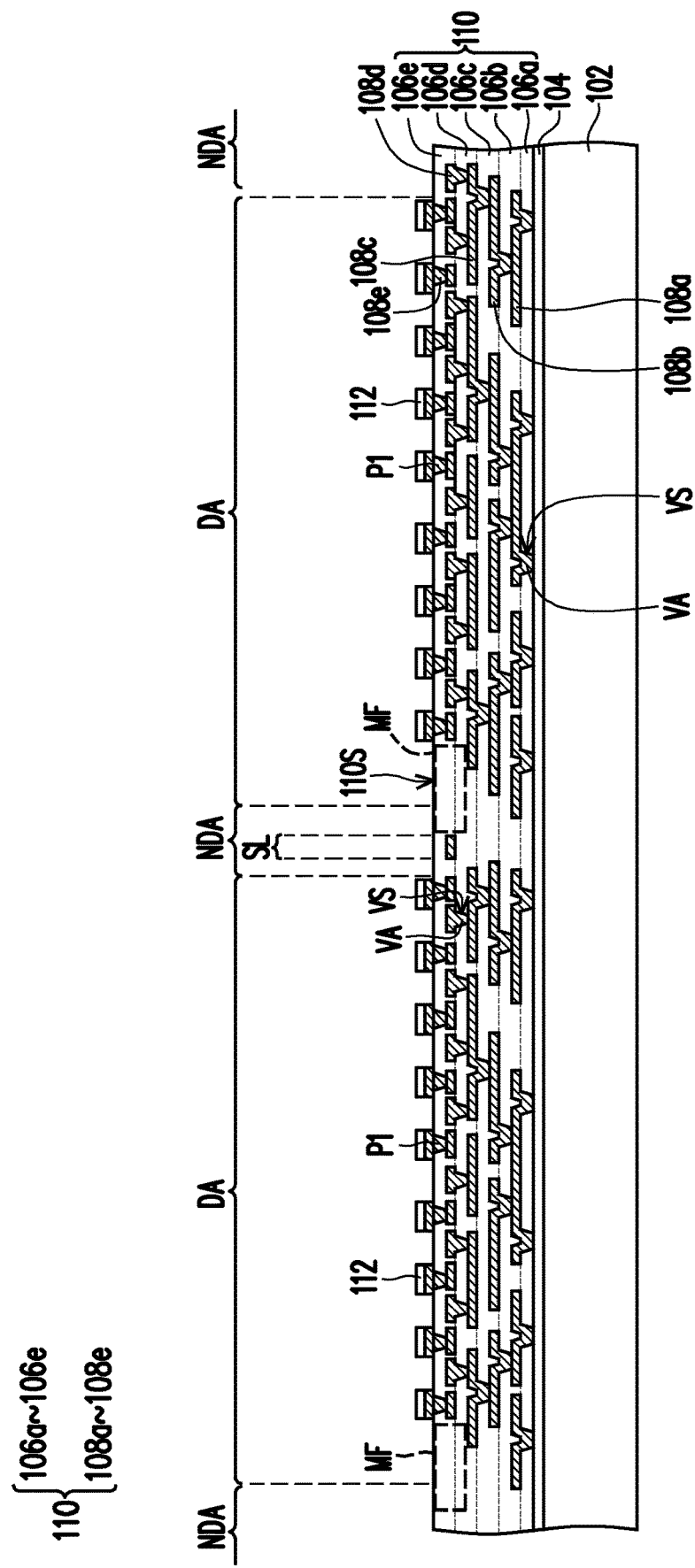

As illustrated in FIG. 2, after forming the redistribution layer 110, bonding portions 112 are respectively formed on the bond pads P1 of the topmost conductive layer 108e. In some embodiments, bonding portions 112 may include contact posts, pre-solder, solder paste, or suitable metal alloy materials for enhancing bonding.

Figure 3:
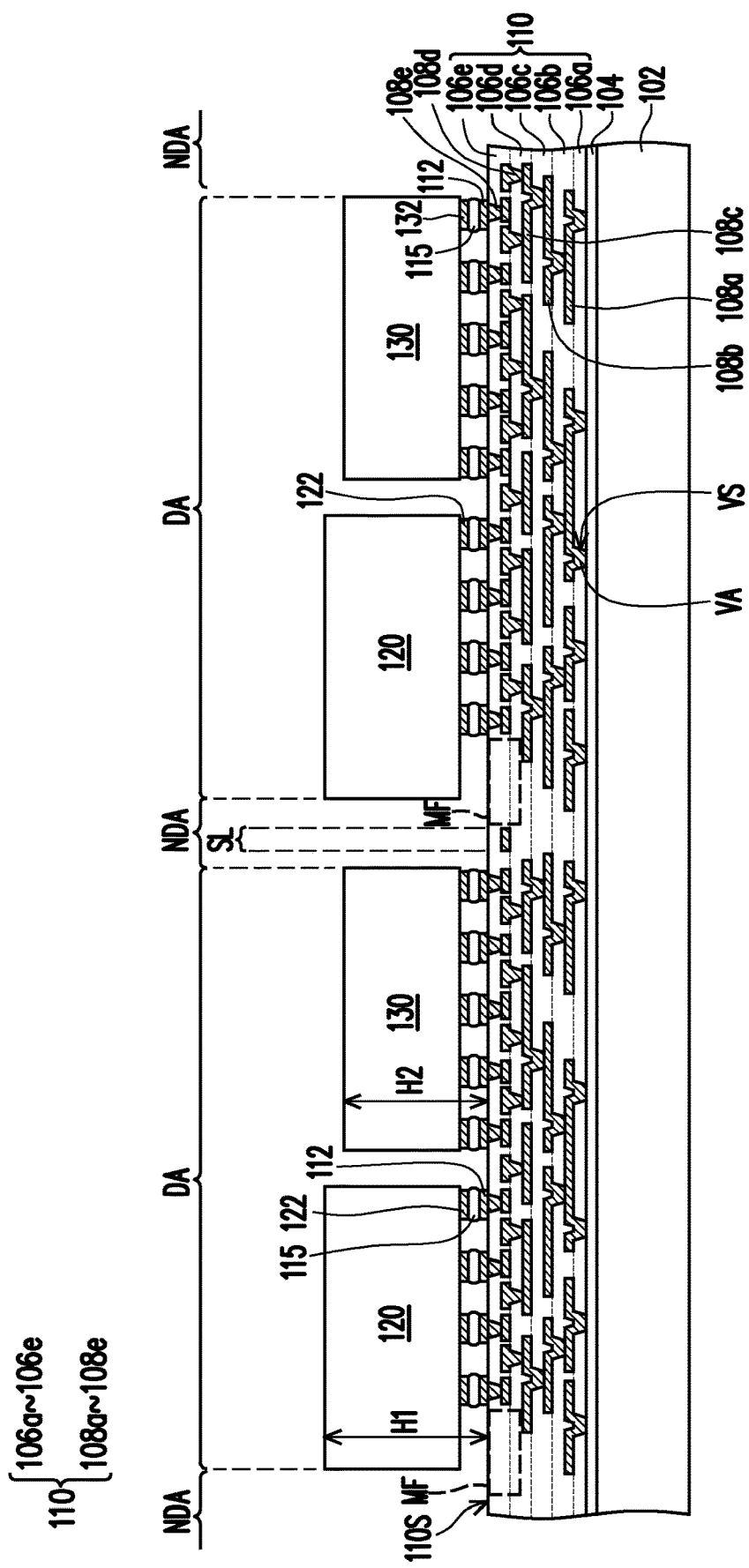

Referring to FIG. 3, two or more first semiconductor dies 120 and two or more second semiconductor dies 130 are provided and placed over the redistribution layer 110 over the carrier 102. In FIG. 3, four dies are shown as the exemplary dies of the package structure, but it is understood that more than four die or two types of dies or different types of dies may be included within the package structure. In some embodiments, the first semiconductor die 120 has a first height H1 (vertically measuring from the surface 110S in the thickness direction), and the second semiconductor die 130 has a second height H2 (vertically measuring from the surface 110S in the thickness direction). In one embodiment, the first height H1 is different from the second height H2. In one embodiment, the second height H2 is smaller than the first height H1.

In some embodiments, the first semiconductor dies 120 may include one or more of an application-specific integrated circuit (ASIC) chip, an analog chip, a sensor chip, a wireless application chip (such as a Bluetooth chip or a radio frequency chip) or a voltage regulator chip. In some embodiments, the second semiconductor dies 130 include one or more memory chips, such as high bandwidth memory chips, dynamic random access memory (DRAM) chips or static random access memory (SRAM) chips. In some embodiments, one of the second dies 130 may be a memory die including memory chips, and the other die 120 may be a system-on-chip (SoC) die including a controller chip. In certain embodiments, dies and chips may be used interchangeably.

In certain embodiments, in FIG. 3, the first and second semiconductor dies 120, 130 are respectively provided with contacts 122, 132 facing downward, and the contacts 122, 132 of the semiconductor dies 120, 130 are respectively bonded to the bonding portions 112 on the redistribution layer 110. In one embodiment, the bonding of the semiconductor dies 120, 130 to the redistribution layer 110 includes performing a reflow process to bond the contacts 122, 132 and the bonding portions 112 through a solder flux to become fused connectors 115. In some embodiments, the contacts 122, 132 are metal pillars, micro-bumps, copper posts, copper alloy posts or other suitable metallic connectors. In certain embodiments, the semiconductor dies 120, 130 are mounted onto the redistribution layer 110 over the carrier 102 side-by-side, and the number of the dies arranged side-by-side or stacked over another die(s) may be adjusted or modified based on the product design but are not limited by the exemplary embodiments. In some embodiments, as illustrated in FIG. 3, based on the locations of the scribe lanes, at least one first semiconductor die 120 and at least one second semiconductor die 130 are included in each package unit after scribing.

As seen in FIG. 3, after mounting and bonding the first and second dies 120, 130 to the redistribution layer 110, the wiring-free zones MF are located below the first semiconductor dies 120. That is, as seen in FIG. 3 and from the planar top view of FIG. 13, the span of the first die 120 is overlapped with the span of the wiring-free zones MF. Although the wiring-free zones MF is shown in FIG. 3 to be located below the first semiconductor die 120, it is possible to be located below the second semiconductor due 130 or both.

Figure 4:
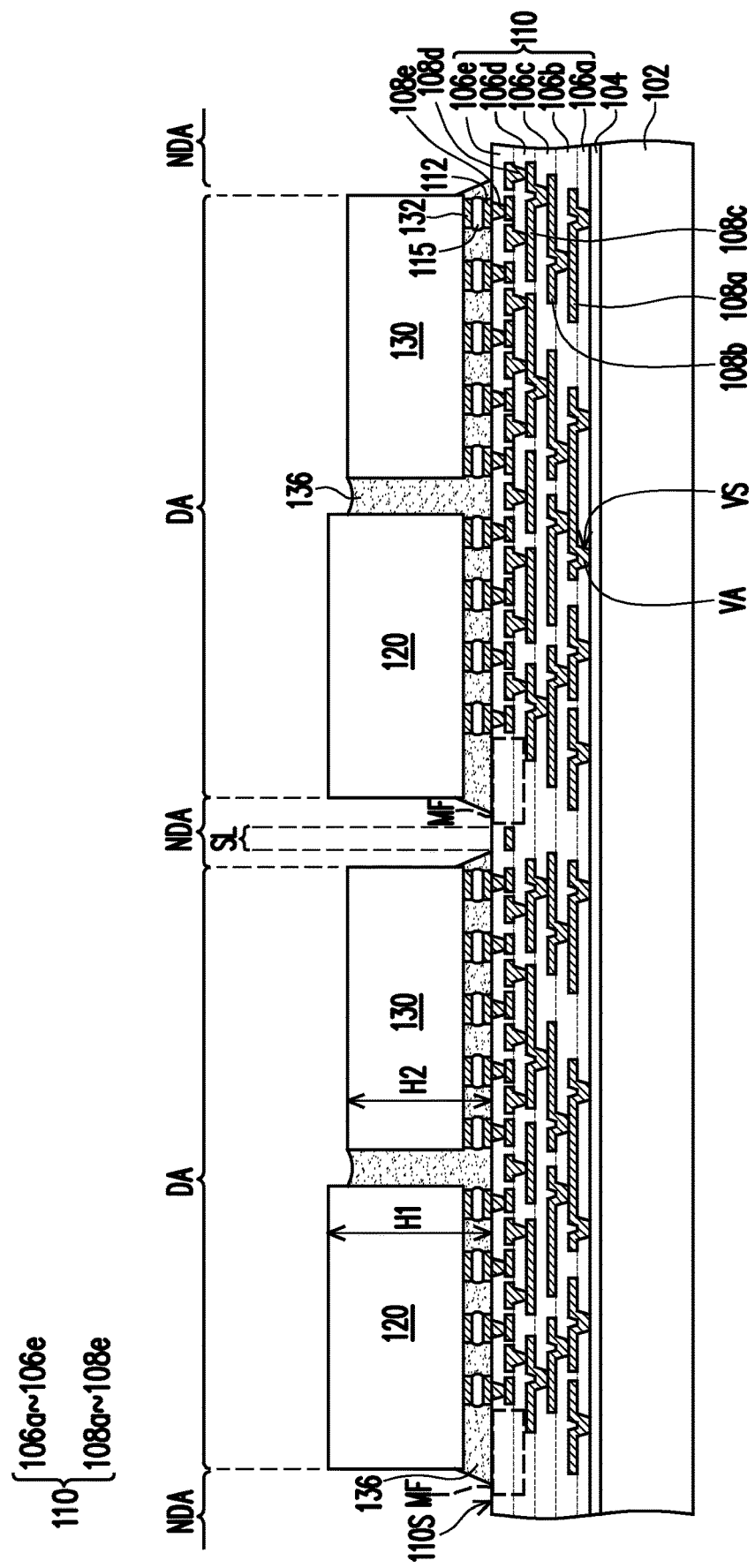

In some embodiments, referring to FIG. 4, an underfill 136 is filled between the first and second semiconductor dies 120, 130 and the redistribution layer 110, encapsulating the bonded contacts 122, 132 and bonding portions 112 for better attachment. More particularly, the underfill 136 may prevent the thermal stress concentrated on the joints between the contacts and the bonding portions. In some embodiments, the underfill 136 at least partially fills the gaps between the first and second semiconductor dies 120 and 130. In some embodiments, the material of the underfill 136 includes epoxy resins or other suitable polymer material. In some embodiments, the underfill 136 is formed by performing a capillary filling process and then a low temperature curing process. As the wiring-free zones MF is located below the first semiconductor die 120, the wiring-free zones MF are in direct physical contact with the underfill 136 that is filled between the first and second semiconductor dies 120, 130 and the redistribution layer 110.

Figure 5:
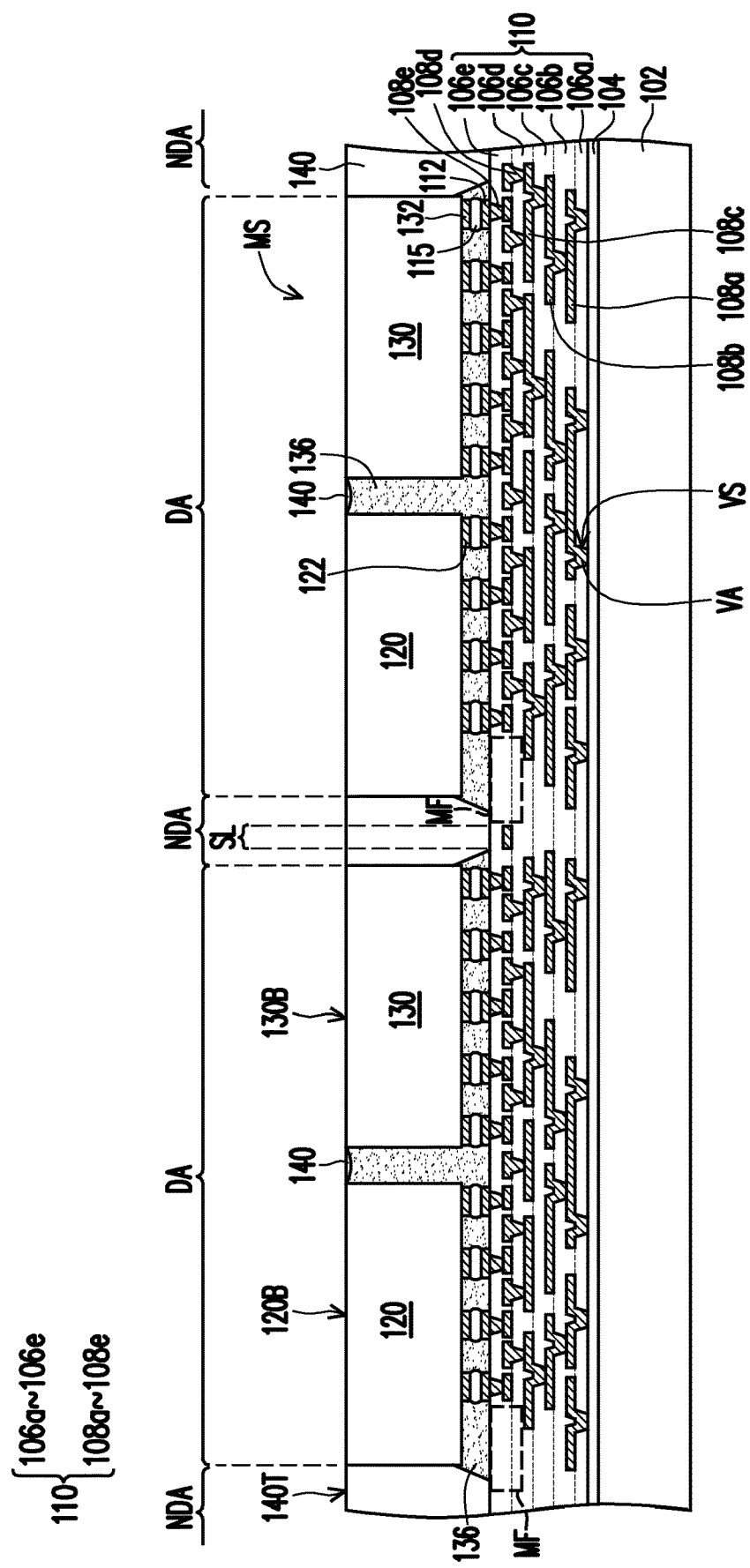

Referring to FIG. 5, in some embodiments, the first and second semiconductor dies 120 and 130 located on the redistribution layer 110 are molded and encapsulated in a molding compound 140 to form a molded structure MS. In one embodiment, the molding compound 140 fills the spaces between the first and second semiconductor dies 120 and 130 and the underfill 136. In some embodiments, the molding compound 140 at least laterally wraps around the first and second semiconductor dies 120 and 130 on the redistribution layer 110. In one embodiment, the material of the molding compound 140 includes epoxy resins, phenolic resins or silicon-containing resins. In some embodiments, the material of the molding compound 140 includes filler particles such as silica particles. In some embodiments, the molding compound 140 is over-molded and then planarized to expose back surfaces 120B and 130B of the first and second semiconductor dies 120 and 130. In some embodiment, the over-molded molding compound 140 is polished until the back surfaces 120B, 130B of the first and second semiconductor dies 120 and 130 are exposed. In one embodiment, after the planarization, a top surface 140T of the molding compound 140 and the back surfaces 120B, 130B of the first and second semiconductor dies 120 and 130 become substantially levelled and flush with one another. In some embodiments, the molding compound 140 is planarized through a grinding process or a chemical mechanical polishing (CMP) process.

Figure 6:
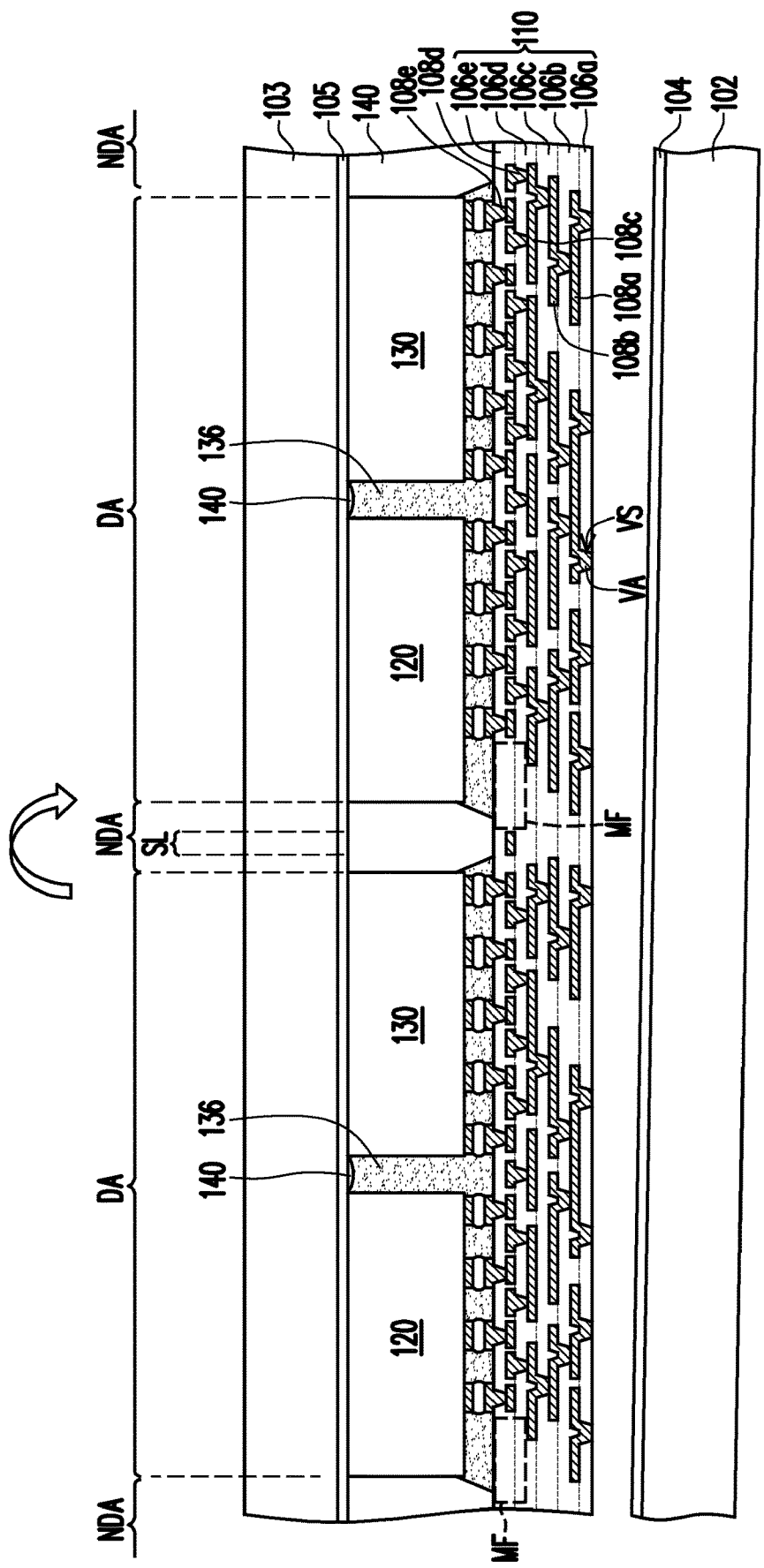

Referring to FIG. 6, in some embodiments, another carrier 103 with a debonding layer 105 is attached to the molded structure MS (attached to the back surfaces 120B, 130B of the first and second semiconductor dies 120 and 130). Afterwards, the whole structure is turned upside down (flipped), and the carrier 102 is detached from the molded structure MS through the debonding layer 104 and then removed. After the carrier 102 is detached from the molded structure MS, the vias VA of the conductive layer 108a (first metallization layer) are exposed from the surface of the dielectric layer 106a of the redistribution layer 110.

Figure 7:
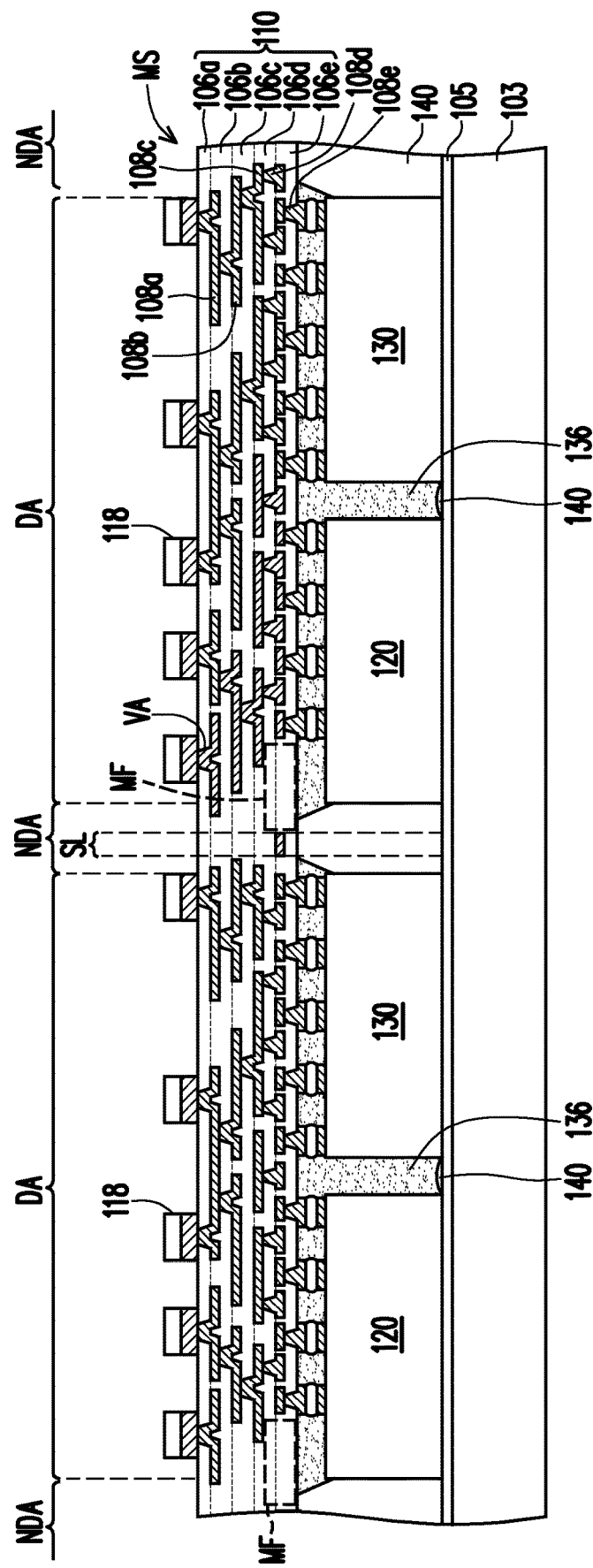

In some embodiments, referring to FIG. 7, joining portions 118 are formed on the redistribution layer 110. In some embodiments, the joining portions 118 are formed on the exposed vias VA of the topmost conductive layer 108a of the redistribution layer 110. In some embodiments, the joining portions 118 are electrically connected with the redistribution layer 110 (the conductive layers 108a, 108b, 108c, 108d, 108e). In embodiments, the formation of joining portions 118 includes forming a mask pattern (not shown) with openings on the redistribution layer 110, forming a metallic material filling up the openings to form metallic portions and then removing the mask pattern.

In some embodiments, the materials of the joining portions 118 may be selected from copper, cobalt, nickel, aluminum, tungsten, alloys or combinations thereof. In some embodiments, the joining portions 118 further optionally include an adhesion layer, a seed layer, pre-solder, solder paste and/or under-ball metallurgy (UBM) patterns formed on the surfaces of the joining portions for enhancing bonding. For example, the joining portions 118 may be formed by electroplating or deposition. In some embodiments, the conductive joining portions 118 are, for example, microbumps, metal posts, metal posts with solder paste, electroless nickel electroless palladium immersion gold (ENEPIG) formed bumps, or controlled collapse chip connection (C4) bumps.

Figure 8:
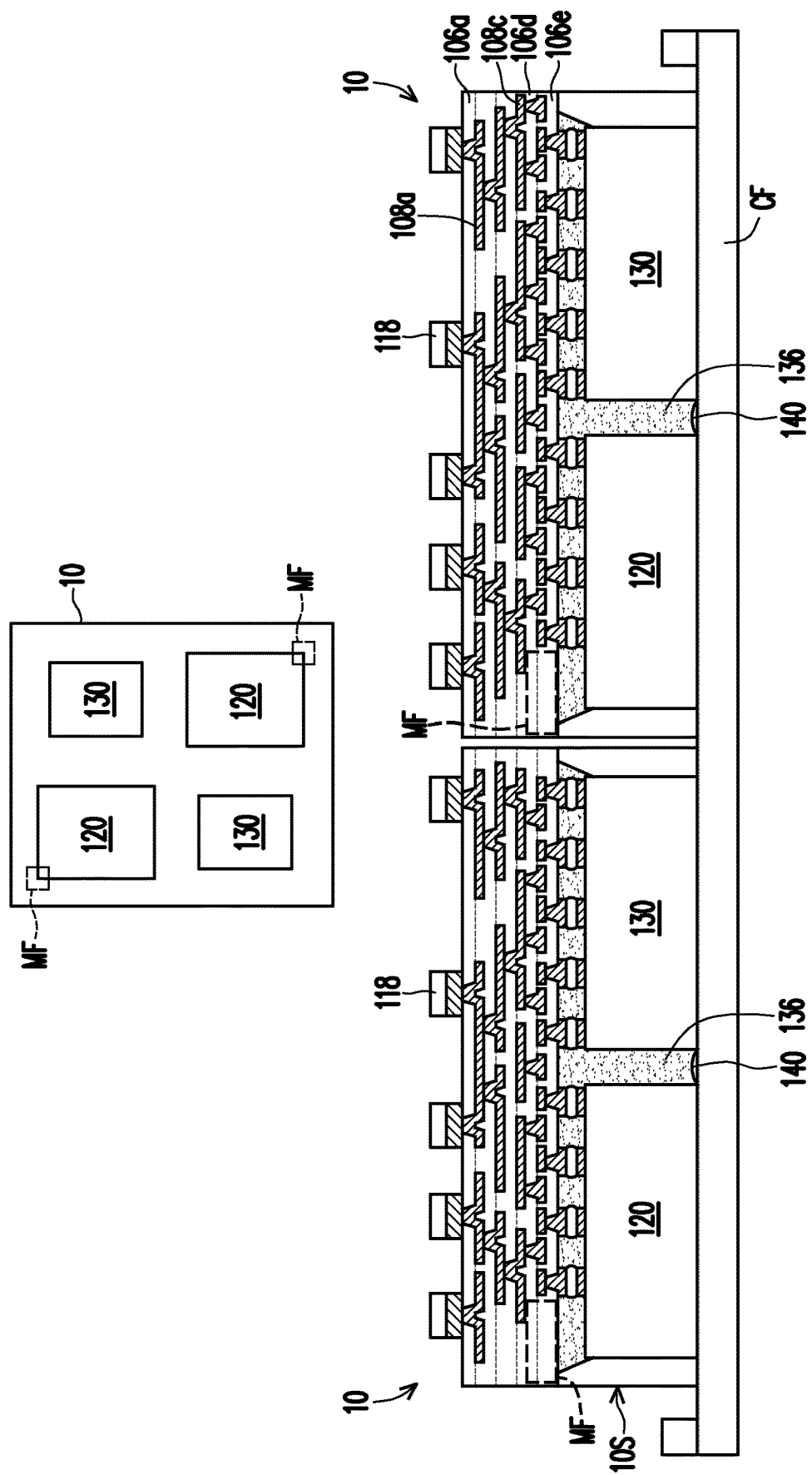

In some embodiments, referring to FIG. 8, after the joining portions 118 are formed, the carrier 103 is detached from the molded structure MS through the debonding layer 105 and is then removed. The molded structure MS is transferred to and disposed on a carrier tape film CF (attached to the back surfaces 120B, 130B of the first and second semiconductor dies 120 and 130).

Referring to FIG. 8, in some embodiments, after placing the molded structure MS on the carrier tape film, the molded structure MS is singulated by performing a dicing process along the scribing lanes SL (cutting lanes). In some embodiments, the dicing process is performed to cut the whole molded structure MS (at least cutting though the redistribution layer 110 and the molding compound 140) into individual and separated semiconductor packages 10. In one embodiment, the dicing process is a wafer dicing process including mechanical sawing, blade dicing and/or laser cutting. In some embodiments, as the wiring-free zones MF are located beside the scribing lanes SL, the cutting blade or dicing saw does not pass through the wiring-free zones MF. That is, the wiring-free zones MF are not diced or damaged during the dicing process. In some embodiments, the carrier tape film CF is later removed.

As seen in FIG. 8, the wiring-free zone MF is located right on the underfill 136 and the metal-free zone MF extends vertically from the underfill 136, through the dielectric layer 106e to the dielectric layer 106d. In some embodiments, the metal-free zone MF extends horizontally across the corner edge of the first semiconductor die 120 and extends beyond the underfill 136. In some embodiments, the metal-free zone MF extends from a location above the underfill 136 and the first semiconductor die 120 to a location above the molding compound 140 (extending beyond the first semiconductor die 120 and the underfill 136). Within the semiconductor package 10, the metal-free zone MF is sandwiched between the underfill 136 and the conductive layer 108c of the redistribution layer 110. In some embodiments, the metal-free zone MF extends from a location above the semiconductor die 120 to the sidewall 10S of the package structure 10.

At the left of FIG. 8, an exemplary schematic top view of the package structure 10 is shown. In some embodiments, as seen in the schematic top view at the left of FIG. 8, two metal-free zones MF are respectively formed below first semiconductor dies 120 and the two metal-free zones MF are respectively located at two outer corners of the two first semiconductor dies 120 arranged along a diagonal line of the package structure 10. In some embodiments, at least one metal-free zone MF is formed at one outer corner of one of the semiconductor dies packaged in the package structure 10. In some embodiments, the metal-free zone(s) MF is formed below and at the outer corner of the die that has a larger die size or has multiple functionality.

Depending on the types of the semiconductor dies or the number of the semiconductor dies, two, three or more metal-free zones MF are formed at two, three or more outer corners of the semiconductor dies of the package structure.

According to the above exemplary embodiments, the layout and configuration of the redistribution layer may be suitably formed within the integrated fan-out (InFO) wafer-level package structure or a fan-in wafer-level package structure. Although one frontside redistribution layer is described in the above embodiments, more than one or multiple redistribution layers (RDLs) may be provided in the package structure or arranged on both front side and back side of the die(s) or chip(s) for signal redistributions among multiple dies or chips. Additionally, the semiconductor package 10 may further include additional dies or sub-package units disposed over the dies and another redistribution layer(s) may be formed to electrically connect the additional dies or sub-package units. The structures and/or the processes of the present disclosure are not limited by the exemplary embodiments.

Figure 9:
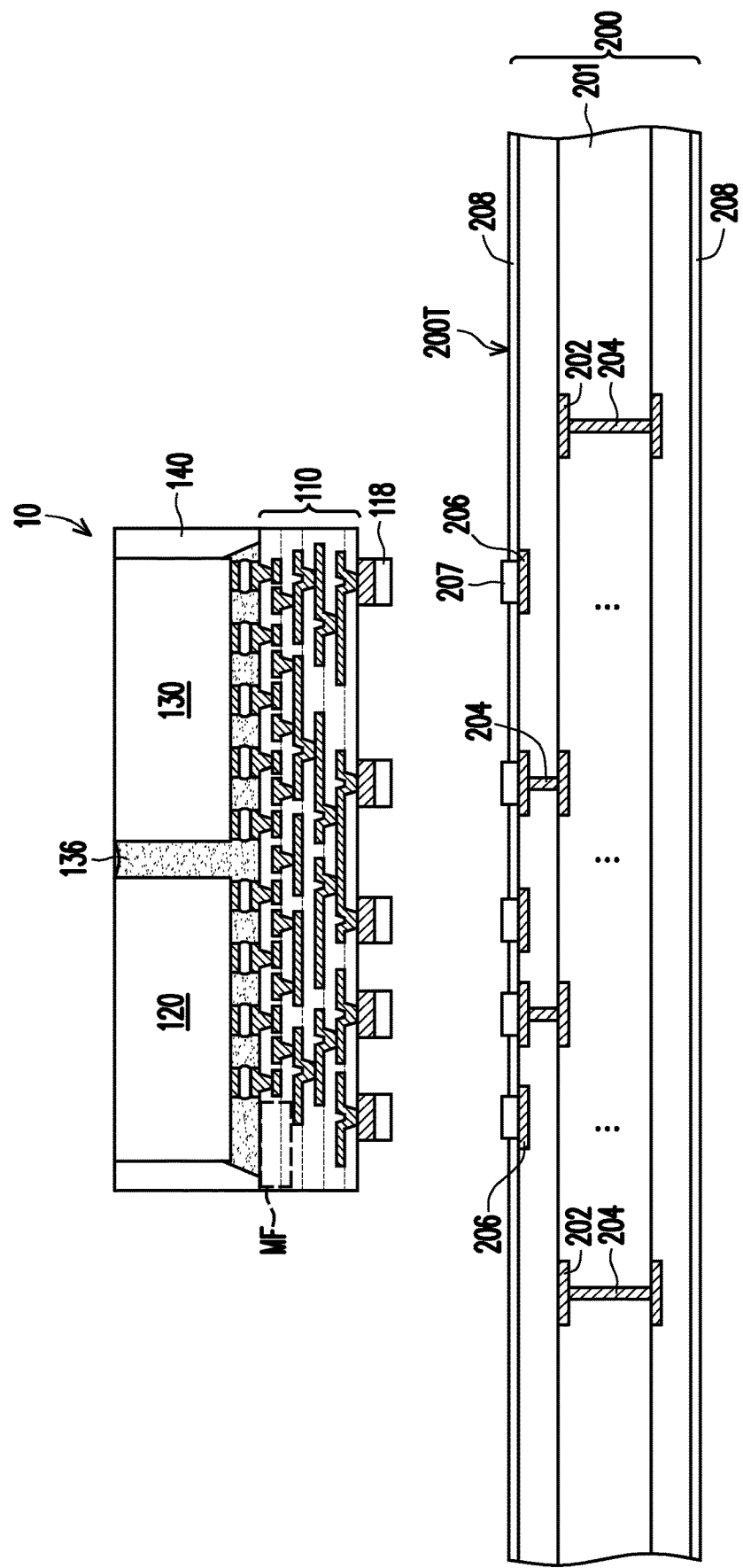
FIG. 9 to FIG. 11 are schematic cross-sectional views illustrating the structures formed at various stages of a manufacturing method of a semiconductor package connected to a circuit substrate according to some embodiments of the present disclosure.
Figure 10:
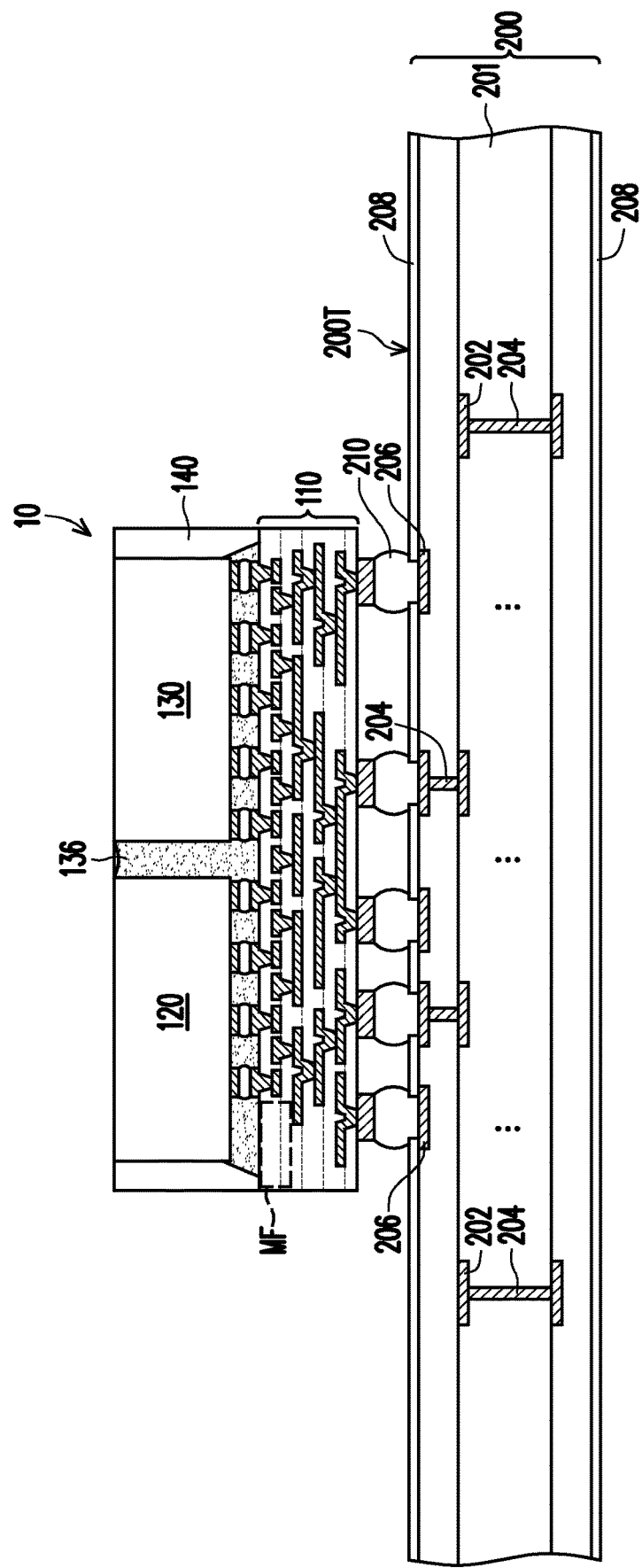
Figure 11:
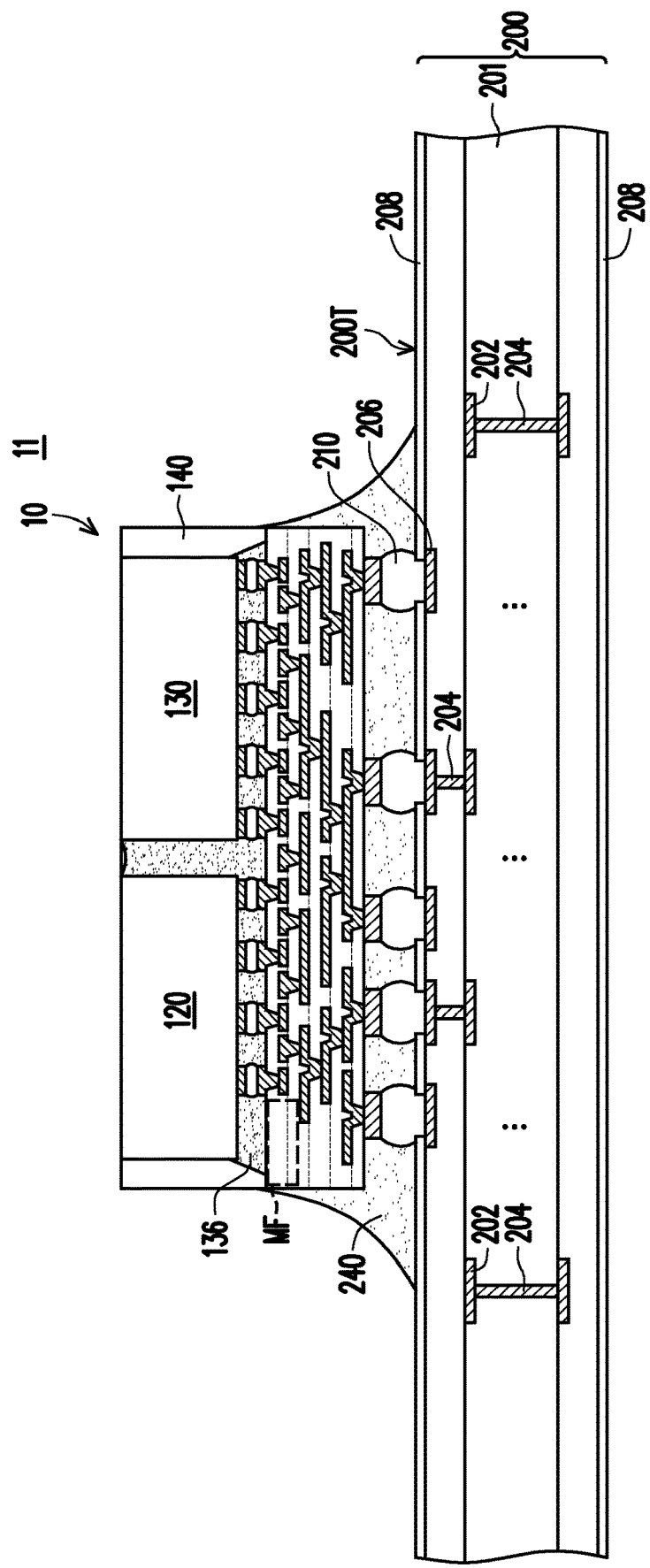

FIG. 9 to FIG. 11 are schematic cross-sectional views illustrating the structures formed at various stages of a manufacturing method of a semiconductor package connected to a circuit substrate according to some embodiments of the present disclosure.

In some embodiments, referring to FIG. 9, a circuit substrate 200 is provided. In some embodiments, the circuit substrate 200 includes a build-up board, a printed circuit board, a laminated board or a flexible laminate board. In some embodiments, the circuit substrate 200 may include one or more active components, passive components, or a combination thereof. In some embodiments, the circuit substrate 200 includes a dielectric material core structure 201, metallization patterns 202, though vias 204 embedded in the dielectric material core structure 201 and bond pads 206 electrically connected to the metallization patterns 202 and the vias 204. In some embodiments, the metallization patterns 202 are designed to electrically connect the various components such as the active components and/or passive components embedded in the circuit substrate to form functional circuitry. The circuit substrate 200 may provide single-side or dual-side electrical connection. In some embodiments, the circuit substrate also includes passivation layers 208 covering the opposite sides of the circuit substrate 200.

In some embodiment, the material of the metallization patterns 202 includes a metallic material includes copper, aluminum, nickel, cobalt, gold, silver, tungsten a combination thereof, or the like. In one embodiment, the dielectric material of dielectric material core structure 201 includes an organic dielectric material. In some embodiments, the dielectric material of the dielectric material core structure 201 may include Ajinomoto build-up films, polymeric materials (e.g., polyimide, polyesters, benzocyclobutene, polybenzoxazole, or the like), prepreg, resin coated copper (RCC), photo image dielectric (PID), phenolic paper, phenolic cotton paper, woven fiberglass cloth, impregnated woven fiberglass cloth, a molding compound, or a combination thereof. In some embodiments, the dielectric material core structure 201 of the circuit substrate 200 may be formed by compression molding, over-molding and planarization, lamination, or other suitable techniques. In some embodiments, the metallization patterns 202, the vias 204 and the pads 206 may be formed by one or more plating processes, for example, electro-plating, electroless-plating, immersion plating, or the like.

In some embodiments, as seen in FIG. 9, the bond pads 206 of the circuit substrate 200 are used for receiving connectors, bumps or other components. In some embodiments, the bond pads 206 includes solder paste 207 and/or pre-solder formed on the surfaces of the bond pads 206 for subsequent bonding. Also, referring to FIG. 9, one or more packages 10 are provided. The package(s) 10 may include similar or the same configurations as described above and may be fabricated following the manufacturing method as depicted from FIG. 1 to FIG. 8.

Referring to FIG. 10, the semiconductor package 10 is disposed on the circuit substrate 200 and bonded to the circuit substrate 200. In some embodiments, the package 10 is mounted to the top surface 200T of the circuit substrate 200 and the package structure 10 is bonded to pads 206 of the circuit substrate 200 via the joining connectors 210. In some embodiments, through performing a reflow process, the joining portions 118 of the package structure 10 and the solder paste 207 on the bond pads 206 of the substrate 200 are joined and fused together to become fused connectors 210. In some embodiments, the reflow process includes performing a thermal process to turn the joining portions 118 into a melted state or a semi-melted state to integrate and bond with the solder paste 207 to become the fused connectors 210 located between the package structure 10 and the circuit substrate 200. The reflow temperature may be higher than a melting point of joining portions 118 and/or the solder paste. In some embodiments, the sizes or dimensions of the connectors 210 are larger than the sizes or dimensions of the fused connectors 115 in the package structure 10. Through these conductive connections and the redistribution structure, the semiconductor dies 120, 130 of finer pitches are electrically connected with the circuit substrate 200 of further larger pitches.

In FIG. 11, in some embodiments, an underfill 240 is formed and filled between the package structure 10 and the circuit substrate 200 to form a semiconductor device package structure 11. In some embodiments, the underfill 240 is filled between the package 10 and the circuit substrate 200 and filled between the fused connectors 210 that are located between the package unit 10 and the circuit substrate 200. In some embodiments, the underfill 240 is formed as a void-free filling material filling up the spaces between the package unit 10 and the circuit substrate 200. The underfill 240 can protect the fused connectors 210 against thermal or physical stresses and further secure the package 10 located on the circuit substrate 200.

In some embodiments, in FIG. 11, the underfill 240 is formed by capillary underfill filling (CUF) and the underfill 240 not only fills up the gaps between the package structure 10 and the circuit substrate 200 but also overflows to partially cover the sidewalls of the redistribution layer 110. In some other embodiments, the underfill 240 may be formed by transfer molding, and the sidewalls of the underfill 240 are vertically aligned with the sidewalls of the redistribution layer 110. In some embodiments, a curing process may be performed to solidify the underfill 240.

In some embodiments, as seen in FIG. 11, the metal-free zone MF that is located under the semiconductor die 120 and extends to the edge of the package 10 is sandwiched between the underfill 136 of the package 10 and the underfill 240. As only the dielectric material without any metallization patterns, vias and traces is sandwiched between the underfill 136 of the package 10 and the underfill 240, the dielectric material in the metal-free zone MF functions as a better buffer for relieving the stress caused by the CTE mismatch between the semiconductor die and the circuit substrate. Hence, no or less cracking occurs in the underfill(s), and the robustness and reliability of the package device structure become better.

Since no metallization patterns or traces are contained in the wiring-free zone(s) MF located at one or more corners of the package structure(s) 10, the dielectric material in the wiring-free zone MF helps to reduce the underfill cracking and leads to stronger attachment between the package and the circuit substrate, and the reliability of the whole device structure is enhanced.

The disclosure is not limited neither by the type nor the number of semiconductor packages 10 connected to the circuit substrate 200. In the drawings of the present disclosure, an integrated fan-out (InFO) package is shown as the semiconductor package unit for purpose of illustration. However, it will be apparent that other types of semiconductor packages may be used to produce semiconductor device package structures including the circuit substrate disclosed herein, and all these semiconductor devices are intended to fall within the scope of the present description and of the attached claims. For example, Chip-On-Wafer-On-Substrate (CoWoS) structures, three-dimensional integrated circuit (3DIC) structures, Chip-on-Wafer (CoW) packages, Package-on-Package (PoP) structures may all be used as the semiconductor package units, alone or in combination.

Figure 12:
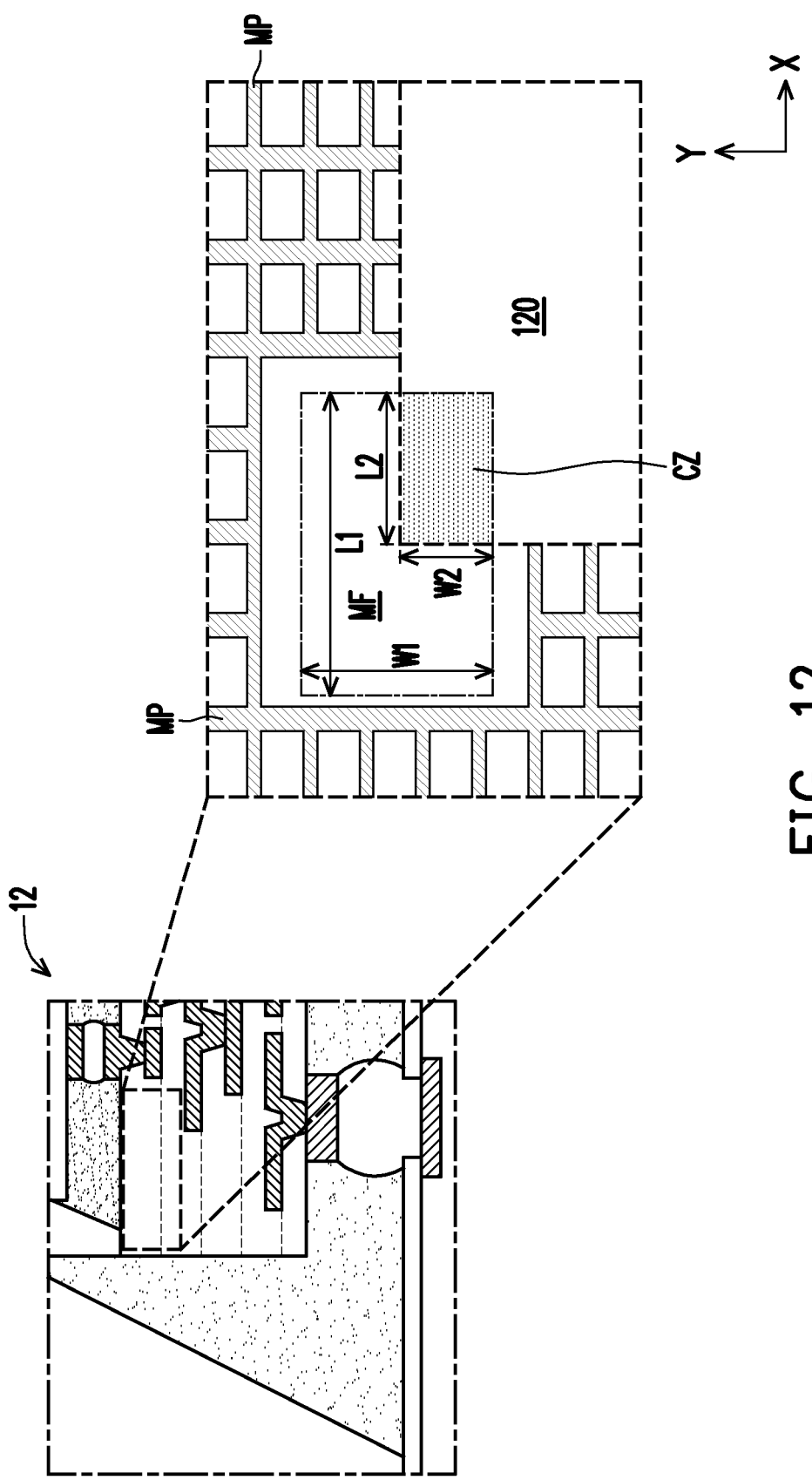
FIG. 12 is a schematic planar view illustrating the exemplary layout of the wiring-free zone of the redistribution layer in a package structure according to some exemplary embodiments of the present disclosure.

FIG. 12 illustrates the exemplary layout of the wiring-free zone in the redistribution layer of a package structure 12 according to some exemplary embodiments of the present disclosure. As seen from the planar view at the right side of FIG. 12, the span or orthogonal projection (dotted line) of the semiconductor die 120 is partially overlapped with the span or orthogonal projection (dashed line) of the wiring-free zone MF on the same horizontal plane. It is seen in FIG. 12, the wiring-free zone MF has a rectangular shape with a length L1 in the first direction X and a width W1 in the second direction Y perpendicular to the first direction X. In FIG. 12, the corner region (shaded region) of the wiring-free zone MF is overlapped with the corner region of the span of the semiconductor die 120. That is, a corner region CZ of the wiring-free zone MF is overlapped with the orthogonal projection of the semiconductor die 120. In some embodiments, as seen in FIG. 12, the overlapped corner region CZ (shaded region) has a rectangular shape with a length L2 in the X direction and a width W2 in the Y direction. In some embodiments, the length L2 of the corner region CZ is smaller than the length L1 of the wiring-free zone MF, and the ratio of L2/L1 is about 0.5. In some embodiments, the width W2 of the corner region CZ is smaller than the width W1 of the wiring-free zone MF, and the ratio of W2/W1 is about 0.5. In some embodiments, the area ratio of the corner region CZ to the wiring-free zone MF is about 1:4. It is understood that the planar-view shape of the wiring-free zone MF is not limited to a rectangular, square or tetragonal shape, and the shape of the wiring-free zone MF may be polygonal, round, oval or other suitable shapes. As seen from the planar view at the right side of FIG. 12, some of the metallization patterns MP that are located outside the span of the semiconductor die 120 are also located outside the span of the wiring-free zone MF. That is, some of the metallization patterns MP are located between the wiring-free zone MF and the sidewall of the package structure 12, and these peripheral metallization patterns MP may provide structural strength but are electrically redundant. Herein, the peripheral metallization patterns are not shown in the partial cross-sectional view of the package structure 12 shown at the left of FIG. 12, and it is understood that the layout or configuration of the conductive layer or metallization patterns MP is merely exemplary and is not intended to limit the scope of the present disclosure.

Figure 13:
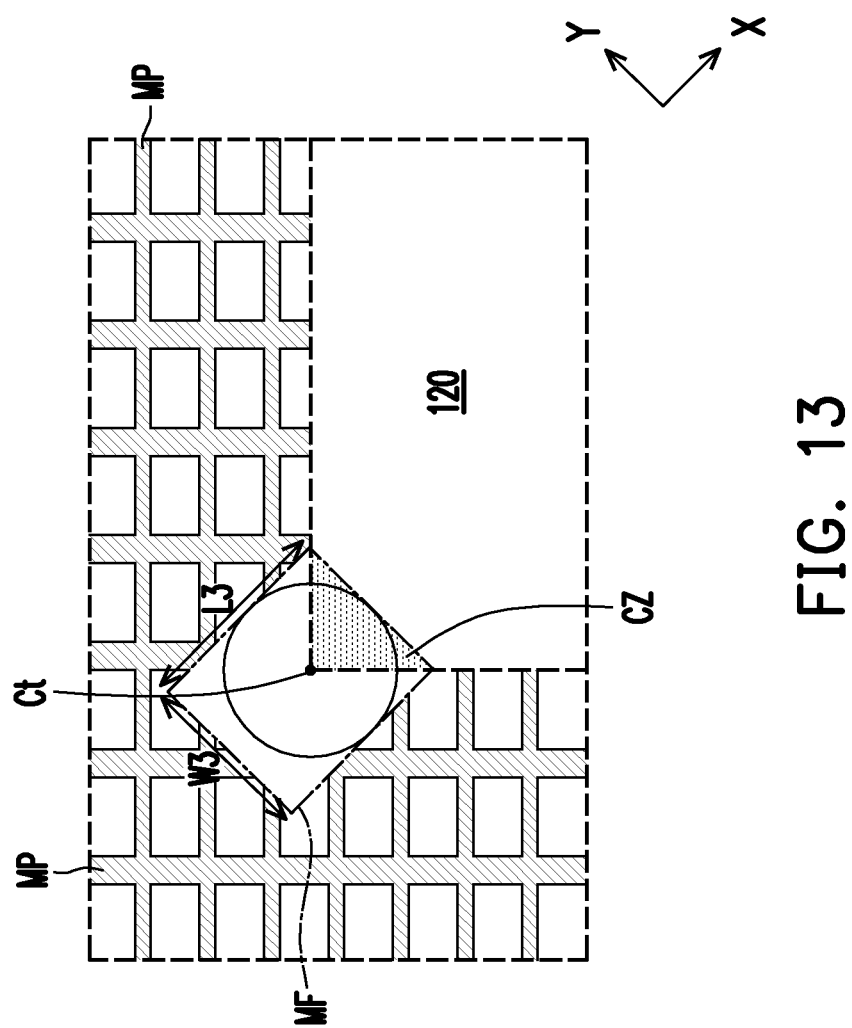
FIG. 13 is a schematic planar view illustrating the exemplary layout of the wiring-free zone in a package structure according to some exemplary embodiments of the present disclosure.

FIG. 13 is a schematic planar view illustrating the exemplary layout of the wiring-free zone in a package structure according to some exemplary embodiments of the present disclosure. As seen in FIG. 13, the span or orthogonal projection (dotted line) of the semiconductor die 120 is partially overlapped with the span or orthogonal projection (dashed line) of the wiring-free zone MF on the same plane. In FIG. 13, the corner region CZ (shaded region) of the wiring-free zone MF is overlapped with the corner region of the span of the semiconductor die 120, and the overlapped corner region CZ has a triangular shape. As seen in FIG. 13, within the overlapped corner region (the shaded region), considering the corner edge (point Ct) as the center of a circle and the circle has a semidiameter of SC (e.g. about 10 microns), the overlapped corner region CZ shall be large enough to include at least a sector (e.g. a quadrant) of the circle therein, so that the overlapped corner region CZ is large enough to relieve the stress. In some embodiments, the overlapped corner region CZ (shaded region) has a triangular shape, while the wiring-free zone MF has a rectangular shape with a length L3 and a width W3. In some embodiments, the area ratio of the corner region CZ to the wiring-free zone MF ranges from about 0.3 to 0.5. In FIG. 13, the layout or configuration of the conductive layer or metallization patterns MP is merely exemplary and is not intended to limit the scope of the present disclosure.

Figure 14:
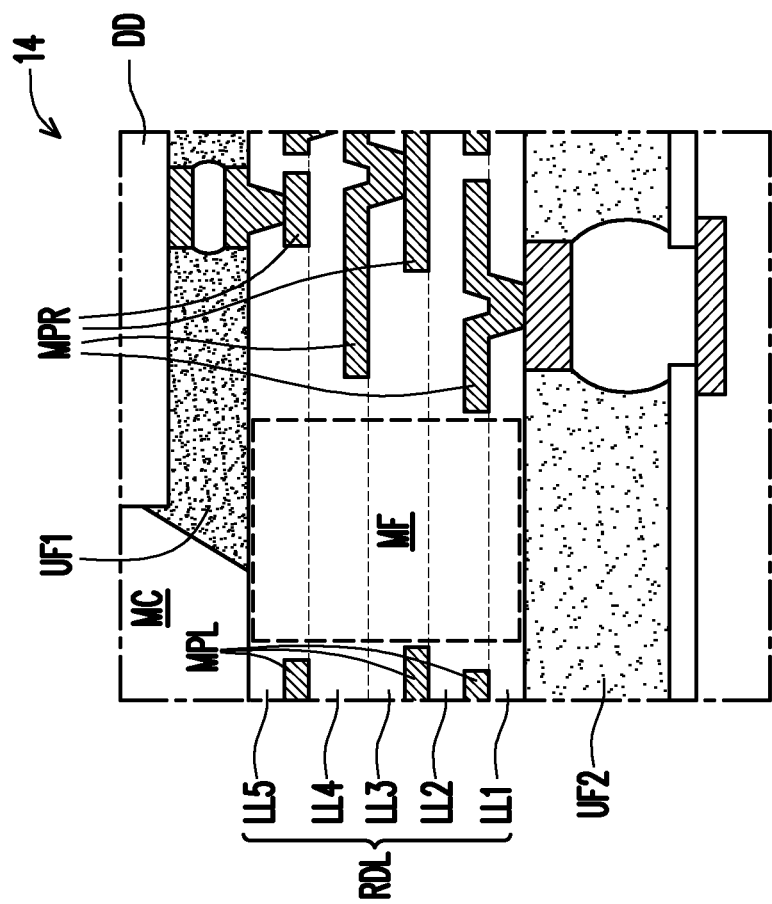
FIG. 14 is a schematic enlarged partial cross-sectional view showing a portion of a package structure attached to a circuit substrate according to some exemplary embodiments of the present disclosure.

FIG. 14 is a schematic enlarged partial cross-sectional view showing a portion of a package structure 14 connected to a circuit substrate according to some exemplary embodiments of the present disclosure. As seen in FIG. 14, the wiring-free zone MF is located below the die DD and the underfill UF1, and the metal-free zone MF extends vertically from the underfill UF1 and through the stacked sub-layers LL5-LL1 of the whole redistribution layer RDL. In some embodiments, as seen in FIG. 14, the metal-free zone MF, which is substantially defined by the adjacent metallization patterns MPL and MPR, has no metallic wirings, routing line or vias, and extends horizontally from a location below the die DD, across the corner edge of the die DD and extends beyond the underfill UF1 to a location below the molding compound MC. In some embodiments, the metal-free zone MF extends from a location below the die DD, across the corner edge of the die DD to a location below the underfill UF1. In some embodiments, as seen in FIG. 14, within the package structure 14, the metal-free zone MF is sandwiched between the underfill UF1, the molding compound MC and the underfill UF2. In some embodiments, the metal-free zone MF does not extend to the sidewall of the package structure 14. In some embodiments, the metallization patterns MPL are located between the wiring-free zone MF and the sidewall of the package structure 14, and these peripheral metallization patterns MPL may include structural reinforcing patterns or seal rings. In some embodiments, the metallization patterns MPL may be provided for layout symmetry or pattern density tuning for manufacturing purposes. In some embodiments, the metallization patterns MPL are not provided for electrical connection purposes but for improving structural strength of the package structure.

In some embodiments, the metal-free zone(s) located under the corner region of the semiconductor die(s) is sandwiched between the underfill wrapping around the micro bumps and the underfill wrapping around the C4 bumps. As the wiring-free or metal-free zone(s) includes only the dielectric material but contains no metallization patterns, vias and traces, the wiring-free zone(s) may be considered as a buffer dielectric block sandwiched between the underfill of the package and the underfill for the bumps functions to relieves the stress caused by the CTE mismatch between the semiconductor die and the circuit substrate. Hence, no or less cracking occurs in the underfill(s), and the robustness and reliability of the package device structure become better. Furthermore, less underfill cracking and better attachment between the package and the circuit substrate are achieved, and the reliability of the whole device structure is enhanced.

According to some embodiments, a semiconductor package has at least a semiconductor die and a redistribution layer. The redistribution layer is disposed on an active surface of the semiconductor die and electrically connected with the semiconductor die. The redistribution layer has a wiring-free zone arranged at a location below a corner of the semiconductor die. An underfill is disposed between the semiconductor die and the redistribution layer. The wiring-free zone is located below the underfill and is in contact with the underfill. An orthogonal projection of the semiconductor die is partially overlapped with an orthogonal projection of the wiring-free zone on a horizontal plane. The wiring-free zone extends horizontally from the semiconductor die, across a sidewall of the semiconductor die and extends to the underfill According to some embodiments, a package structure at least has a first die, a second die, a circuit substrate and a redistribution layer. The first die and the second die are arranged side by side. The circuit substrate is disposed under the first and second dies and electrically with the first and second dies. The redistribution layer is disposed between the first and second dies and the circuit substrate, and electrically connected with the first and second dies. The redistribution layer comprises a wiring-free zone arranged at a location below an outer corner of the first die. The first underfill is disposed between the first and second dies and the redistribution layer. The second underfill disposed between the redistribution layer and the circuit substrate. The wiring-free zone located below the first underfill is in contact with the first underfill, and the wiring-free zone is located between the first underfill and the second underfill.

According to some embodiments, a manufacturing method for a package structure is provided. After providing a carrier, a redistribution layer having sub-layers and a wiring-free zone is formed. A first die is disposed over the redistribution layer to occupy a portion of the wiring-free zone and a second die is disposed over the redistribution layer and beside the first die. The first die and the second die are bonded to the redistribution layer. The first and second dies are electrically connected to the redistribution layer. An underfill is dispensed between the first and second dies and the redistribution layer. A molding compound is formed to encapsulate the underfill and the first and second dies. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a semiconductor die;
   a redistribution layer, disposed on an active surface of the semiconductor die and electrically connected with the semiconductor die, wherein the redistribution layer comprises a wiring-free zone arranged at a location below a corner of the semiconductor die, an orthogonal projection of the semiconductor die is partially overlapped with an orthogonal projection of the wiring-free zone on a horizontal plane, and a corner region of the wiring-free zone is overlapped with a corner region of the orthogonal projection of the semiconductor die; and
   an underfill disposed between the semiconductor die and the redistribution layer,
   wherein the wiring-free zone located below the underfill is in contact with the underfill, and the wiring-free zone extends horizontally from the semiconductor die, across a sidewall of the semiconductor die and to the underfill.

2. The semiconductor package as claimed in claim 1, further comprising a molding compound disposed on the redistribution layer and laterally wrapping the underfill and the semiconductor die.

3. The semiconductor package as claimed in claim 1, wherein the redistribution layer includes a dielectric layer and redistribution patterns embedded therein, and the wiring-free zone is located in the dielectric layer.

4. The semiconductor package as claimed in claim 3, wherein the redistribution layer further includes metallization patterns, and the metallization patterns are located between the wiring-free zone and an outer sidewall of the redistribution layer.

5. The semiconductor package as claimed in claim 1, wherein an area ratio of the corner region to the wiring-free zone is about 1/4.

6. The semiconductor package as claimed in claim 1, wherein an area ratio of the corner region to the wiring-free zone ranges from about 0.3 to about 0.5.

7. The semiconductor package as claimed in claim 1, further comprising a circuit substrate electrically connected with the semiconductor die and a bottom underfill filled between the circuit substrate and the redistribution layer.

8. The semiconductor package as claimed in claim 7, wherein the wiring-free zone is located between the underfill and the bottom underfill.

9. A package structure comprising:
   a first die and a second die, arranged side by side;
   a circuit substrate, disposed under the first and second dies and electrically with the first and second dies;
   a redistribution layer, disposed between the first and second dies and the circuit substrate, and electrically connected with the first and second dies, wherein the redistribution layer comprises a wiring-free zone below the first die, and a corner region of the wiring-free zone is overlapped with a corner region of an orthogonal projection of the first die at a location of an outer corner of the first die;
   a first underfill disposed between the first and second dies and the redistribution layer; and
   a second underfill disposed between the redistribution layer and the circuit substrate,
   wherein the wiring-free zone extends horizontally from the first die, across a side wall of the first die and extends at least to the first underfill so that the wiring-free zone located below the first underfill is in contact with the first underfill, and the wiring-free zone is located between the first underfill and the second underfill.

10. The structure as claimed in claim 9, wherein the wiring-free zone is located at a location below the outer corner of the first die.

11. The structure as claimed in claim 9, wherein the wiring-free zone extends horizontally from the first die, along the first underfill and extends beyond the first underfill.

12. The structure as claimed in claim 9, wherein the redistribution layer includes multiple sub-layers and the wiring-free zone extends vertically through at least one sub-layer of the multiple sub-layers of the redistribution layer.

13. The structure as claimed in claim 9, wherein the redistribution layer includes multiple sub-layers and the wiring-free zone extends vertically through two or more sub-layers of the multiple sub-layers of the redistribution layer.

14. The structure as claimed in claim 9, wherein the redistribution layer includes multiple sub-layers and the wiring-free zone extends vertically through all of the multiple sub-layers of the redistribution layer.

15. The structure as claimed in claim 9, further comprising a molding compound disposed on the redistribution layer and laterally wrapping the first underfill and the first and second dies.

16. The package structure as claimed in claim 9, wherein the second underfill covers a sidewall of the wiring-free zone.

17. A manufacturing method for a package structure, comprising:
   providing a carrier;
   forming a redistribution layer having sub-layers and a wiring-free zone;
   disposing a first semiconductor die over the redistribution layer to occupy a portion of the wiring-free zone and disposing a second semiconductor die over the redistribution layer and beside the first semiconductor die, wherein the wiring-free zone is located at a location below a corner of the first semiconductor die, an orthogonal projection of the first semiconductor die is partially overlapped with an orthogonal projection of the wiring-free zone on a horizontal plane, and a corner region of the wiring-free zone is overlapped with a corner region of the orthogonal projection of the first semiconductor die;
   bonding the first semiconductor die and the second semiconductor die to the redistribution layer, wherein the first and second semiconductor dies are electrically connected to the redistribution layer;
   dispensing an underfill between the first and second semiconductor dies and the redistribution layer, wherein the wiring-free zone located below the underfill is in contact with the underfill, and the wiring-free zone extends horizontally from the first semiconductor die, across a sidewall of the first semiconductor die and to the underfill;
   forming a molding compound to encapsulate the underfill and the first and second semiconductor dies; and
   removing the carrier.

18. The method as claimed in claim 17, wherein forming the redistribution layer comprises forming metallization patterns in the sub-layers outside the wiring-free zone to define the wiring-free zone.

19. The method as claimed in claim 17, further comprising performing a dicing process after forming the molding compound, wherein the dicing process is performed to cut through the molding compound and the redistribution layer without cutting the wiring-free zone to form packages.

20. The method as claimed in claim 19, further comprising providing a circuit substrate, bonding the packages to the circuit substrate and forming a bottom underfill between the packages and the circuit substrate.

* * * * *